(12) United States Patent
Tan et al.

(10) Patent No.: US 10,824,137 B2
(45) Date of Patent: Nov. 3, 2020

(54) MOUNTING BOARD MANUFACTURING SYSTEM

(71) Applicant: Panasonic Intellectual Property Management Co., Ltd., Osaka (JP)

(72) Inventors: Inlin Tan, Fukuoka (JP); Takuya Yamazaki, Fukuoka (JP); Takaaki Yokoi, Fukuoka (JP); Narumi Atsuta, Tokyo (JP); Atsushi Nakazono, Kanagawa (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/992,259

(22) Filed: May 30, 2018

(65) Prior Publication Data

US 2018/0364687 A1 Dec. 20, 2018

(30) Foreign Application Priority Data

Jun. 19, 2017 (JP) .................................. 2017-119218
Oct. 4, 2017 (JP) .................................. 2017-193978

(51) Int. Cl.
  *G05B 19/418* (2006.01)
(52) U.S. Cl.
  CPC .................. *G05B 19/41805* (2013.01); *G05B 2219/33034* (2013.01); *G05B 2219/35059* (2013.01); *G05B 2219/45031* (2013.01)
(58) Field of Classification Search
  CPC ........... H05K 13/0408; H05K 13/0413; H05K 13/0815; H05K 13/0812; H05K 13/083;
  (Continued)

(56) References Cited

U.S. PATENT DOCUMENTS 5,621,811 A * 4/1997 Roder .................. G01N 23/043
  348/126
6,539,107 B1 * 3/2003 Michael ............. G06K 9/00201
  382/145
(Continued)

FOREIGN PATENT DOCUMENTS

CN 1816275 A 8/2006
EP 3119176 A1 1/2017
(Continued)

OTHER PUBLICATIONS

Kamen et al. (Stencil Printing Process Modeling and Control Using Statistical Neural Networks, IEEE, 2008 (Year: 2008).*

(Continued)

*Primary Examiner* — Darrin D Dunn
(74) *Attorney, Agent, or Firm* — Pearne & Gordon LLP

(57) ABSTRACT

A mounting board manufacturing system includes a component placing device; a library; an operation information counter; and a corrector. The component data includes a control parameter for executing the component placing work by the component placing device, and information regarding the component. The operation information counter counts a score of the component placing work for each component data based on operation information including a result executed by the component placing device. The corrector selects correction component data that is a target to be corrected from a plurality of the component data based on the score and corrects the control parameter of the correction component data.

8 Claims, 8 Drawing Sheets

(58) Field of Classification Search
CPC .... H05K 13/0015; H05K 13/02; H05K 13/04; H05K 13/0882; H05K 13/0452; H05K 13/0813; H05K 1/0269; H05K 3/303; H05K 3/341; H05K 13/089; H05K 3/0008; Y02P 90/22; Y02P 90/14; G05B 19/41875; G05B 13/0285; G05B 19/402; G05B 2219/31477; G05B 2219/32187; G05B 2219/32192; G05B 2219/32222; G05B 2219/36043; G05B 2219/36195; G05B 2219/37214

See application file for complete search history.

(56) References Cited

U.S. PATENT DOCUMENTS

| Patent/Pub No. | Kind | Date | Inventor | Class |
|---|---|---|---|---|
| 6,631,552 | B2* | 10/2003 | Yamaguchi | H05K 13/0813 29/739 |
| 6,763,130 | B1* | 7/2004 | Somekh | G05B 19/41875 382/145 |
| 6,842,656 | B1* | 1/2005 | Burkhardt | B21B 37/00 700/109 |
| 7,401,728 | B2* | 7/2008 | Markham | G06Q 50/00 235/375 |
| 7,533,459 | B2* | 5/2009 | Kano | H05K 13/08 29/832 |
| 7,536,236 | B2* | 5/2009 | Yano | G05B 19/41805 700/121 |
| 7,885,718 | B2* | 2/2011 | Yano | G05B 19/41805 700/65 |
| 7,899,561 | B2* | 3/2011 | Maenishi | H05K 13/0853 700/28 |
| 8,086,338 | B2* | 12/2011 | Yano | G05B 19/41805 700/108 |
| 8,181,337 | B2* | 5/2012 | Watanabe | H05K 13/0215 29/832 |
| 8,224,063 | B2* | 7/2012 | Kameda | G06T 7/73 356/399 |
| 8,875,383 | B2* | 11/2014 | Ohno | H05K 13/0417 29/701 |
| 9,706,664 | B2* | 7/2017 | Okamoto | H05K 3/1233 |
| 9,910,428 | B2* | 3/2018 | Kawaguchi | H05K 13/0417 |
| 10,123,470 | B2* | 11/2018 | Itoh | H05K 13/0465 |
| 10,162,323 | B2* | 12/2018 | Taniguchi | G01M 1/30 |
| 10,165,719 | B2* | 12/2018 | Itoh | H05K 13/0465 |
| 2001/0032030 | A1* | 10/2001 | Nakahara | H05K 3/0008 700/114 |
| 2002/0056188 | A1* | 5/2002 | Yamaguchi | H05K 13/0417 29/743 |
| 2002/0071602 | A1* | 6/2002 | Nakano | H05K 1/0269 382/151 |
| 2002/0083570 | A1* | 7/2002 | Inoue | H05K 13/0465 29/428 |
| 2002/0099281 | A1* | 7/2002 | Bahr | A61B 5/14542 600/323 |
| 2002/0108239 | A1* | 8/2002 | Isogai | H05K 13/0413 29/834 |
| 2004/0029299 | A1* | 2/2004 | Pasadyn | G05B 19/41865 438/5 |
| 2005/0143849 | A1* | 6/2005 | Hayashi | G05B 19/41875 700/73 |
| 2005/0190956 | A1* | 9/2005 | Fujii | G01N 21/8851 382/141 |
| 2005/0250223 | A1* | 11/2005 | Kano | H05K 13/0413 438/1 |
| 2005/0283337 | A1* | 12/2005 | Sayal | G06Q 10/00 702/179 |
| 2006/0136787 | A1* | 6/2006 | Yano | G05B 19/41805 714/39 |
| 2007/0198219 | A1* | 8/2007 | Havela | G01H 1/003 702/187 |
| 2008/0154392 | A1* | 6/2008 | Maenishi | H05K 13/0853 700/32 |
| 2008/0249742 | A1* | 10/2008 | Scott | G01R 31/31707 702/179 |
| 2008/0289175 | A1* | 11/2008 | Inoue | H05K 3/303 29/840 |
| 2009/0000110 | A1* | 1/2009 | Maenishi | H05K 13/041 29/743 |
| 2009/0077106 | A1 | 3/2009 | Kawase et al. | |
| 2009/0082881 | A1* | 3/2009 | Awata | G05B 19/41805 700/10 |
| 2009/0259333 | A1* | 10/2009 | Yano | G05B 19/41805 700/121 |
| 2010/0152877 | A1* | 6/2010 | Maenishi | H05K 13/0413 700/108 |
| 2010/0175246 | A1* | 7/2010 | Nagao | H05K 13/0061 29/829 |
| 2010/0189340 | A1* | 7/2010 | Ueda | G01N 21/956 382/145 |
| 2010/0325884 | A1* | 12/2010 | Nishino | H05K 3/305 29/833 |
| 2011/0184548 | A1* | 7/2011 | Higashi | H05K 13/0417 700/121 |
| 2011/0283530 | A1* | 11/2011 | Ao | H05K 13/0812 29/739 |
| 2012/0102726 | A1* | 5/2012 | Kaida | H05K 13/0452 29/705 |
| 2012/0189188 | A1* | 7/2012 | Nagai | G06T 7/001 382/145 |
| 2012/0206732 | A1* | 8/2012 | Sumi | H05K 13/0061 356/500 |
| 2012/0314395 | A1* | 12/2012 | Yamauchi | H05K 13/0061 361/837 |
| 2012/0317802 | A1* | 12/2012 | Yamamoto | H05K 13/0417 29/832 |
| 2013/0010101 | A1* | 1/2013 | Yamasaki | H05K 13/0413 348/92 |
| 2013/0138594 | A1* | 5/2013 | Kato | G06F 11/3409 706/46 |
| 2013/0173332 | A1* | 7/2013 | Ho | G06Q 10/06 705/7.27 |
| 2015/0107088 | A1* | 4/2015 | Sagara | G06Q 10/063114 29/592.1 |
| 2015/0199224 | A1* | 7/2015 | Mihnev | H04L 43/045 714/37 |
| 2015/0296670 | A1* | 10/2015 | Itoh | H05K 13/08 228/102 |
| 2015/0307288 | A1* | 10/2015 | Sumi | B65G 47/917 29/407.04 |
| 2015/0351295 | A1* | 12/2015 | Itoh | H05K 13/0465 228/102 |
| 2015/0355626 | A1* | 12/2015 | Teshima | H05K 13/0413 700/114 |
| 2016/0148850 | A1* | 5/2016 | David | H01L 22/20 438/5 |
| 2016/0282856 | A1* | 9/2016 | Wachs | G05B 19/41875 |
| 2016/0299495 | A1 | 10/2016 | Ishimoto | |
| 2016/0299499 | A1 | 10/2016 | Ishimoto | |
| 2017/0049013 | A1* | 2/2017 | Kanai | H05K 13/02 |
| 2017/0064883 | A1* | 3/2017 | Kawai | H05K 13/08 |
| 2017/0112029 | A1* | 4/2017 | Shimizu | H05K 13/0413 |
| 2017/0115654 | A1* | 4/2017 | Odai | H05K 13/08 |
| 2017/0308049 | A1* | 10/2017 | Fujii | G05B 19/0426 |
| 2017/0311493 | A1* | 10/2017 | Ito | H05K 13/02 |
| 2017/0311494 | A1* | 10/2017 | Hayashi | H05K 13/08 |
| 2017/0336784 | A1* | 11/2017 | Koppikar | G05B 19/43 |
| 2017/0354073 | A1* | 12/2017 | Oyama | H05K 13/08 |
| 2018/0035580 | A1* | 2/2018 | Kondo | G06T 7/0004 |
| 2018/0098466 | A1* | 4/2018 | Eguchi | G05B 19/402 |
| 2018/0139876 | A1* | 5/2018 | Murano | H05K 13/0417 |
| 2018/0153061 | A1* | 5/2018 | Iisaka | H05K 13/0409 |
| 2018/0153062 | A1* | 5/2018 | Sakurayama | H05K 13/02 |
| 2018/0153063 | A1* | 5/2018 | Takama | H05K 13/08 |
| 2018/0160577 | A1* | 6/2018 | Shibata | H05K 13/08 |
| 2018/0177088 | A1* | 6/2018 | Goto | H05K 13/0069 |
| 2018/0192558 | A1* | 7/2018 | Yamakage | H05K 13/08 |
| 2018/0199480 | A1* | 7/2018 | Taniguchi | H05K 13/083 |
| 2018/0242486 | A1* | 8/2018 | Sugita | H05K 13/08 |
| 2018/0249610 | A1* | 8/2018 | Takama | H05K 13/0815 |

(56) References Cited

U.S. PATENT DOCUMENTS

| | | | | |
|---|---|---|---|---|
| 2018/0279521 A1* | 9/2018 | Nishiyama | ............. | H05K 13/04 |
| 2018/0314918 A1* | 11/2018 | Amano | ..................... | G06T 1/00 |
| 2018/0341248 A1* | 11/2018 | Mehr | ................. | G05B 19/4099 |
| 2018/0351786 A1* | 12/2018 | Pope | ................... | H04L 41/0654 |
| 2018/0358271 A1* | 12/2018 | David | .................... | H01L 22/20 |
| 2019/0045679 A1* | 2/2019 | Endo | ................. | H05K 13/0015 |
| 2019/0053408 A1* | 2/2019 | Kondo | ................ | H05K 13/021 |
| 2019/0143399 A1* | 5/2019 | Kasahara | ............... | B21J 15/142 |
| | | | | 29/525.06 |

FOREIGN PATENT DOCUMENTS

| | | | |
|---|---|---|---|
| JP | 2002-076700 | A | 3/2002 |
| JP | 2004-055710 | A | 2/2004 |
| JP | 2006-216589 | A | 8/2006 |
| JP | 2008-016012 | A | 1/2008 |
| JP | 2014-204058 | A | 10/2014 |
| JP | 2016-035943 | A | 3/2016 |
| JP | 2016-201430 | A | 12/2016 |
| WO | 2015/122272 | A1 | 8/2015 |
| WO | WO-2015115432 | A1 * | 8/2015 |

OTHER PUBLICATIONS

English Translation of Chinese Search Report dated Aug. 4, 2020 for the related Chinese Patent Application No. 201810597318.0.

\* cited by examiner

| LEARNING DATA SET 40A | | | | | | | SCORE | | |
|---|---|---|---|---|---|---|---|---|---|
| | BASIC INFORMATION (※1) | MACHINE PARAMETER (※2) | | | FACILITY CONDITION DATA (※3) | | SUCTION RATE % | RECOGNITION RATE % | LOSS RATE % |
| PATTERN P | | | | | | | | | |
| 1 | | | | | | | 99.5 | 99.1 | 5.0 |
| 2 | | ○ | | | | | 99.6 | 99.6 | 2.9 |
| 3 | | | ○ | | | | 99.6 | 99.7 | 2.2 |
| 4 | | | ○ | | | ○ | 99.8 | 99.8 | 1.7 |
| 5* | | | | | | | 99.5 | 99.4 | 3.3 |
| 6** | | | | | ○ | | 99.9 | 100.0 | 0.2 |
| 7 | | | | ○ | | | 99.9 | 100.0 | 0.3 |
| 8 | | | | | | | 99.9 | 99.9 | 0.4 |

○ MARK: DATA CORRECTION ITEM

MOUNTING BOARD MANUFACTURING SYSTEM

BACKGROUND

1. Technical Field

The present disclosure relates to a mounting board manufacturing system for manufacturing a mounting board by placing a component on a board.

2. Description of the Related Art

A mounting board manufacturing system for manufacturing a mounting board has a component mounting line in which a component installing device executing a component placing work for placing a component on a board is disposed. The component placing work executed by the component installing device is configured of various work operations such as a suction operation for picking up the component by a suction nozzle from a component supplier, a recognition operation for imaging and recognizing a pick-up component, and a placing work for transferring and placing the component on the board. In the work operations, it is required to execute a fine operation with respect to a minute component with high accuracy and high efficiency. Therefore, machine parameters for executing each work operation in a favorable operation mode are set in advance according to a type of the component. Component data associating the machine parameters with the type of the component is stored as a component library (for example, see Japanese Patent Unexamined Publication No. 2004-055710 (PTL 1) and Japanese Patent Unexamined Publication No. 2016-201430 (PTL 2)).

SUMMARY

According to the disclosure, there is provided a mounting board manufacturing system including a component placing device; a library; an operation information counter; and a corrector.

The component placing device executes component placing work for placing a component on a board.

The library that stores a plurality of component data.

Each of the plurality of the component data includes a control parameter for executing the component placing work by the component placing device, and information regarding the component.

The operation information counter counts a score of the component placing work for each component data based on operation information including a result executed by the component placing device.

The corrector selects correction component data that is a target to be corrected from the plurality of the component data based on the score and corrects the control parameter of the correction component data.

BRIEF DESCRIPTION OF THE DRAWINGS

FIG. 5A is an explanatory view of a learning data set used in learning for correcting the component data in the mounting board manufacturing system of the embodiment;

FIG. 5B is an explanatory view of a learning result learned by a learning unit in the mounting board manufacturing system of the embodiment;

FIG. 6 is an explanatory view of a learning data set used in learning for correction of the component data in the mounting board manufacturing system of the embodiment;

DETAILED DESCRIPTION

In the mounting board manufacturing system of the related art, the component data is not necessarily set to an optimum value that enables the work operation to be executed in an optimum operation mode, and is required to be corrected at any time corresponding to a defect event occurring at a time of executing the component placing work. For such correction work of the component data, advanced expertise such as skill based on specialized knowledge and experience regarding the component installation is required. Therefore, in a production site, it takes a lot of labor and effort due to trial and error. For example, when the component placing work is executed, a problem such as defective recognition of the component or a suction error may occur. In such a case, a majority of what kind of parameter item should be corrected depends on know-how of an operator. In a case where data correction is entrusted to an unskilled operator, the unskilled operator repeats trial and error by improper data correction. Therefore, not only the work efficiency of the data correction work but also the improvement of work quality of the component placing work is hindered.

Figure 1:
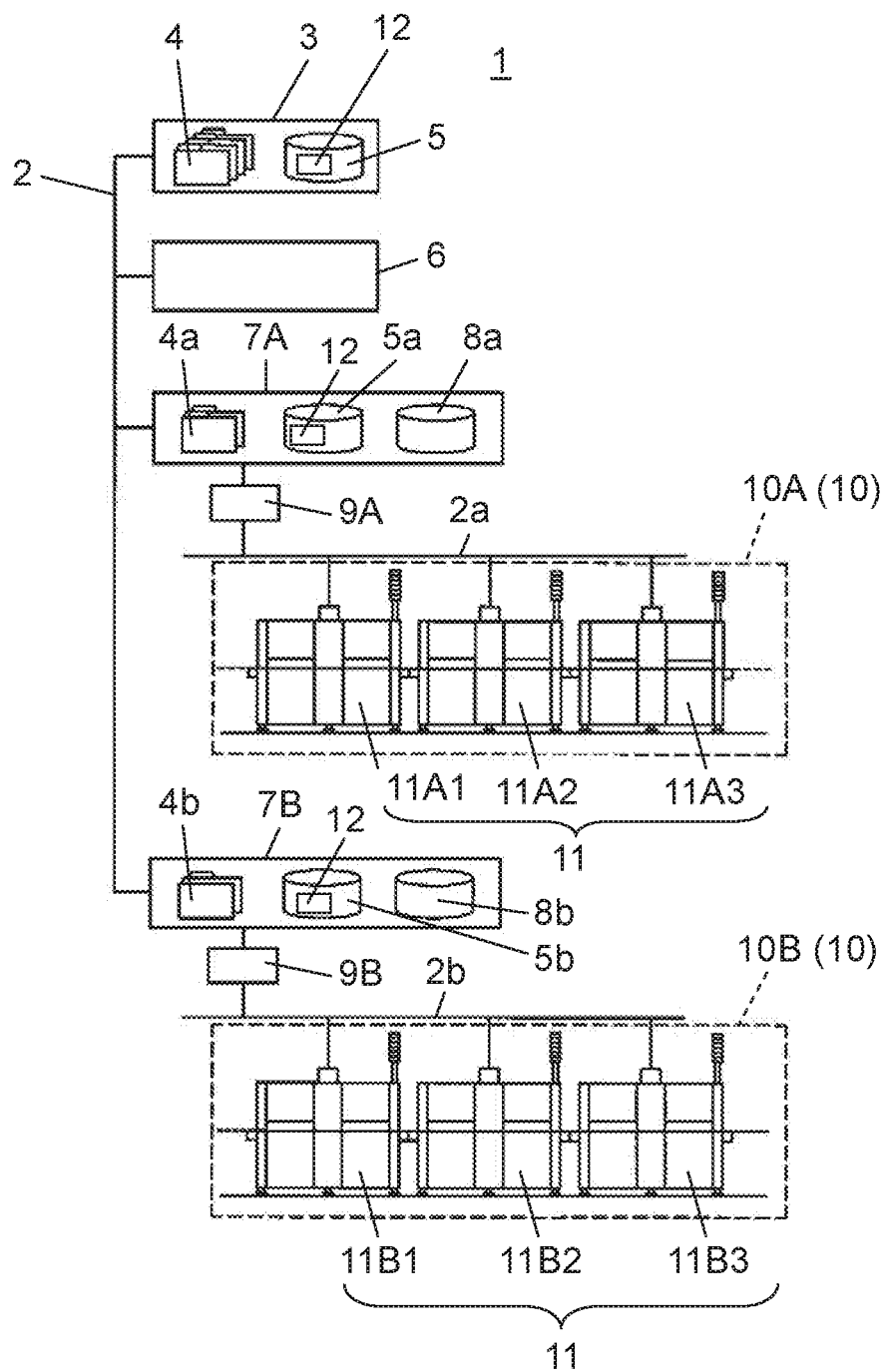
FIG. 1 is an explanatory view of a configuration of a mounting board manufacturing system of an embodiment.

Next, an embodiment will be described with reference to the drawings. First, a configuration of mounting board manufacturing system 1 will be described with reference to FIG. 1. Mounting board manufacturing system 1 has a function of manufacturing a mounting board by placing a component on a board. In FIG. 1, mounting board manufacturing system 1 includes a plurality (here, two) of component mounting lines 10A and 10B. Component placing devices 11A1, 11A2, and 11A3 are disposed in component mounting line 10A. Component placing devices 11B1, 11B2, and 11B3 are disposed in component mounting line 10B. That is, mounting board manufacturing system 1 is configured to have at least one of the component placing devices that execute the component placing work for placing the component on the board.

Component placing devices 11A1, 11A2, and 11A3 are connected to one another by communication network 2a constructed by a local area network or the like, and are also connected to client 7A via data communication terminal 9A. Client 7A has production data 4a, component library 5a (library), and operation information counter 8a. Component placing devices 11B1, 11B2, and 11B3 are connected to one another by communication network 2b, and are also connected to client 7B via data communication terminal 9B.

Client 7B has production data 4b, component library 5b (library), and operation information counter 8b.

In the following description, in a case where it is unnecessary to distinguish component mounting lines 10A and 10B from each other, they are referred to simply as component mounting line 10. Similarly, in a case where it is unnecessary to distinguish component placing devices 11A1, 11A2, and 11A3, and component placing devices 11B1, 11B2, and 11B3 from one another, they are referred to simply as component placing device 11.

Clients 7A and 7B are connected to server 3 and component library manager 6 via communication network 2 constructed by a local area network or an Internet (public line). Server 3 has a function of providing various data used in mounting board manufacturing system 1 to clients 7A and 7B. That is, production data 4 used for the mounting board produced in a factory having component mounting lines 10A and 10B is stored in server 3.

Server 3 has component library 5 in which component data 12 (see FIG. 2) regarding the component used for the mounting board produced in the factory is edited into a form of a master library. Component data 12 is configured to include at least one control parameter for executing component placing work by component placing device 11 and information regarding the component. Component library 5 is a library storing a plurality of component data 12.

In clients 7A and 7B, data necessary for the production of the mounting board by each of component mounting lines 10A and 10B are downloaded from server 3 via communication network 2. That is, among production data 4 stored in server 3, the production data of the mounting boards respectively produced by component mounting lines 10A and 10B are downloaded to clients 7A and 7B as production data 4a and 4b. Similarly, among component data stored in server 3, the component data included in component library 5 used for the mounting board respectively produced by component mounting lines 10A and 10B are downloaded to component libraries 5a and 5b of clients 7A and 7B.

Operation information counters 8a and 8b respectively included in clients 7A and 7B perform count processing of the score of the component placing work executed by component mounting lines 10A and 10B for producing the mounting board for each component data. Here, the score of the component placing work is a success rate or the like in various work operations executed in component placing devices 11 disposed in component mounting lines 10A and 10B.

In the embodiment, as the score of the component placing work, a suction rate, a recognition rate, and a loss rate are exemplified. The suction rate indicates a success rate of the suction operation when the component is picked up by vacuum suction by a placing head from a component supplier. The recognition rate indicates a success rate of the component recognition in which the pick-up component is imaged and recognized by a component recognition camera. The loss rate indicates a proportion of components that are discarded due to a mistake in operation or an operation error among the supplied components. That is, operation information counters 8a and 8b perform the count processing of the score of the component placing work such as the component suction, the component recognition, and the component placement, for each component data, based on operation information including at least a result of processing executed by component placing devices 11 disposed in component mounting lines 10A and 10B, for example, component holding, the component recognition, and component discarding, component placement, or the like.

Component library manager 6 has a function of executing processing for correction of component data 12, processing such as learning of a degree of influence on the score of the component placing work of component data 12, or the like with respect to component libraries 5a and 5b included in clients 7A and 7B as targets. In the embodiment, the learning of the correction of component data 12 and the degree of influence on the correction of component data 12 is repeatedly executed by the function of component library manager 6. Therefore, efficiency of the data correction work and work efficiency of the component placing work are improved.

Figure 2:
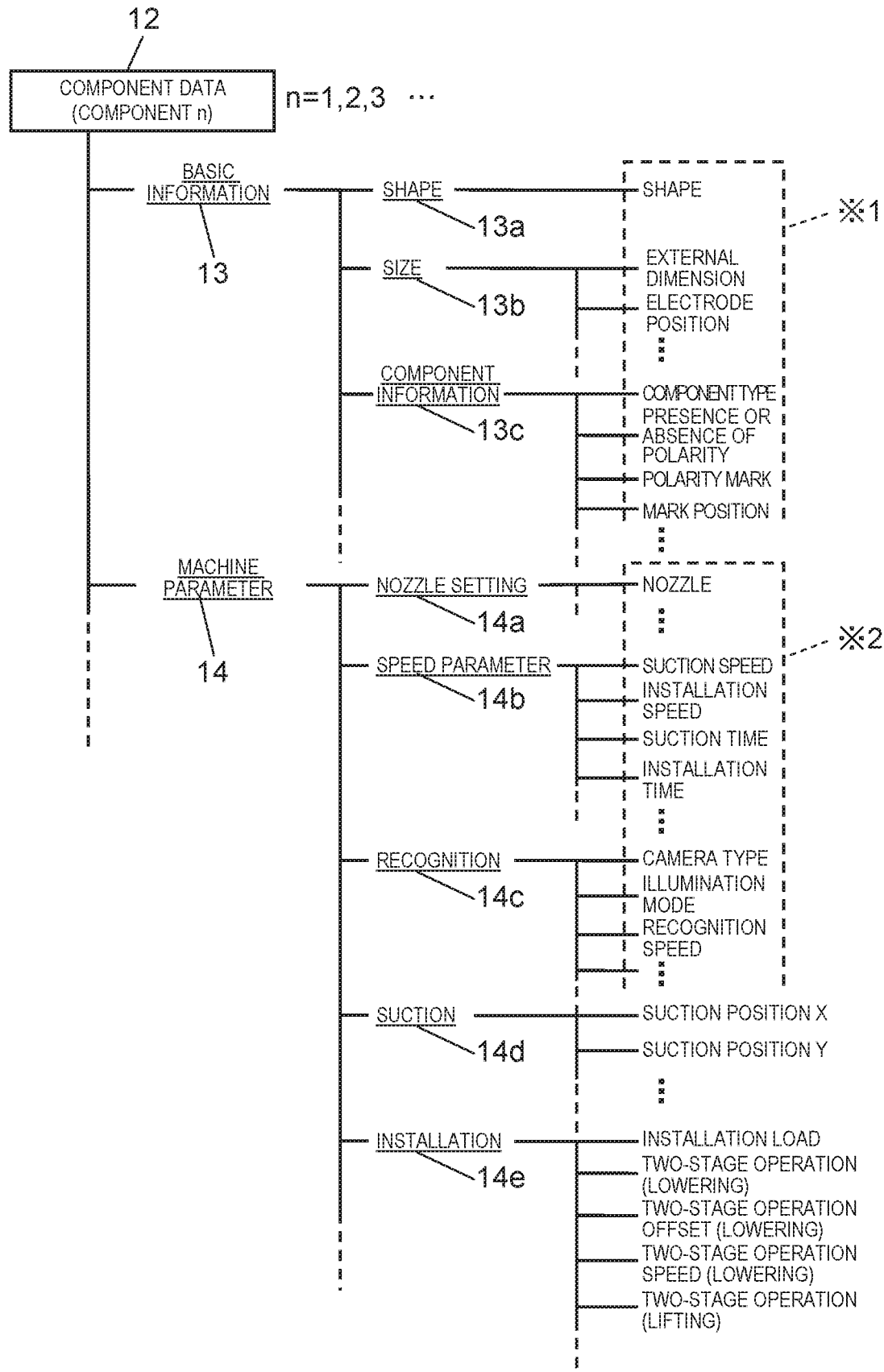
FIG. 2 is an explanatory view illustrating a data configuration of component data used in the mounting board manufacturing system of the embodiment.

Next, a configuration of component data 12 will be described with reference to FIG. 2. Component data 12 is used for the component placing work and is a target of the correction work in executing processing of the component placing work in mounting board manufacturing system 1 of the embodiment. In FIG. 2, component data 12 is stored in component library 5 and component libraries 5a and 5b, and the type of the component is specified by "component n" (component data code). That is, component data 12 for a plurality of types of components included in the component data codes of n=1, 2, 3, . . . are stored in component library 5 and component libraries 5a and 5b.

In component data 12, basic information 13 (information) and machine parameter 14 (control parameter) are defined as major classification items. Basic information 13 is information indicating an attribute unique to the component. Here, "shape" 13a, "size" 13b, and "component information" 13c are exemplified as medium classification items. "Shape" 13a is information regarding the shape of the component and a "shape" indicating by dividing an external shape of the component into a shape such as a rectangular shape or a columnar shape as a minor classification item. In "size" 13b, an "external dimension" indicating the size of the component, an "electrode position" indicating the number and positions of connecting electrodes formed in the component, and the like are defined as minor classification items.

"Component information" 13c is attribute information of the component and the "component type" indicating the type of the component, "presence or absence of a polarity" indicating presence or absence of directionality in the external shape of the component, a "polarity mark" indicating a shape of a mark attached to the component in a case where the polarity is present, or the like, a "mark position" indicating a position of the mark in a case where the polarity mark is present, and the like are defined as the minor classification items.

Machine parameter 14 is a control parameter used for controlling component placing device 11 when the component placing work is executed by component placing device 11 disposed in component mounting line 10 with respect to the component defined in component data 12 as a target. In machine parameter 14 as the major classification item, "nozzle setting" 14a, "speed parameter" 14b, "recognition" 14c, "suction" 14d, and "installation" 14e are defined as the medium classification items.

"Nozzle setting" 14a is data regarding the suction nozzle used in a case where the component is sucked and held, and a "nozzle" for specifying the type of the suction nozzle capable of being selected as the minor classification item is defined. "Speed parameter" 14b is a control parameter regarding a moving speed of the suction nozzle in the work operation in which the component is picked up by the suction nozzle and is installed in the board. In the control parameters, a "suction speed" and a "suction time" when the component is sucked and held, an "installation speed", an "installation time", and the like when the held component is installed in the board are defined as the minor classification items.

"Recognition" 14c is a parameter regarding execution of recognition processing for imaging and recognizing the component picked up by the suction nozzle from the component supplier by the component recognition camera. In the parameters, a "camera type" for specifying the type of the camera used for imaging, an "illumination mode" for indicating a mode of illumination used at the time of imaging, a "recognition speed" when an image acquired by imaging is recognized, and the like are defined as the minor classification items.

"Suction" 14d is a control parameter regarding the suction operation when the component is picked up by the suction nozzle from the component supplier. In the control parameters, "suction position X" and "suction position Y" indicating suction positions when the suction nozzle is landed on the component, and the like are defined as the minor classification items.

"Installation" 14e is a control parameter regarding an installing operation for moving the placing head in which the component is sucked and held by the suction nozzle to the board, and performing an elevating operation in the suction nozzle to install the component on the board. In the control parameters, an "installing load" that is a load for pressing the component against the board when the suction nozzle is lowered and thereby the component is landed on the board is defined as the minor classification item. When a speed of the elevating operation for lowering and lifting the suction nozzle is switched to two stages of high and low, a "two-stage operation (lowering)", a "two-stage operation offset (lowering)", a "two-stage operation speed (lowering)", a "two-stage operation (lifting)", and the like which define operation modes such as a switching height position and a high and low speed are defined.

Figure 3:
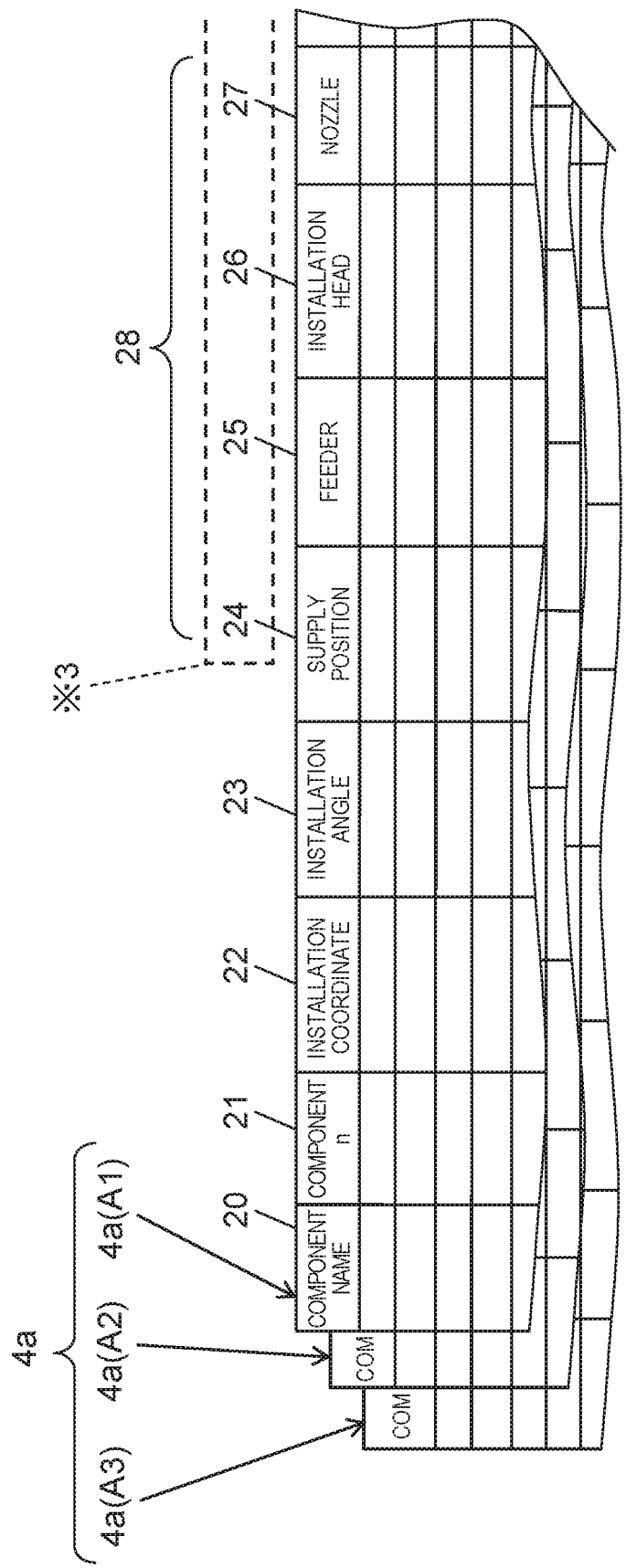
FIG. 3 is an explanatory view illustrating a data configuration of the production data used in the mounting board manufacturing system of the embodiment.

Next, a data configuration of production data 4a used when the mounting boards are manufactured by component placing devices 11A1, 11A2, and 11A3 disposed in component mounting line 10A in mounting board manufacturing system 1 will be described with reference to FIG. 3. Here, production data 4a (A1), production data 4a (A2), and production data 4a (A3) respectively indicate production data 4a used in component placing devices 11A1, 11A2, and 11A3. All of them have the same data configuration and are data contents corresponding to the board type of the mounting board produced by component placing device 11. Here, production data 4a will be described with production data 4a (A1) as a representative example.

Production data 4a (A1) defines data necessary for producing the mounting board of one board type in component placing device 11A1. For example, in production data 4a (A1), "component name" 20, "component n" 21, "installation coordinate" 22, and "installation angle" 23 are defined for each component of the mounting target. "Component name" 20 is a name of the component placed on the mounting board of the board type. "Component n" 21 is a component code for specifying the component by the component library and "installation coordinate" 22 is a coordinate indicating an installation position and an installation angle in the mounting board of the component.

In production data 4a, facility condition data 28 indicating a condition of a facility side used for the production of the mounting board, that is, a setting state in component placing device 11, or the like is defined for each component name. In the example illustrated here, facility condition data 28 is included in production data 4a provided by communication network 2, but only facility condition data 28 may be provided in a form of another file.

In facility condition data 28, "supply position" 24, "feeder" 25, "installing head" 26, "nozzle" 27, a recognition algorithm, and the like are defined. "Supply position" 24 indicates type data indicating the type of component placing device 11 and a position at which the component is supplied in "11A". "Feeder" 25 indicates a part feeder used for supplying the component. "Installing head" 26 indicates the placing head performing the placing work for placing the component.

"Nozzle" 27 indicates the suction nozzle used for holding the component. The recognition algorithm is used for the component recognition of the component held by the nozzle. Facility condition data 28 is a condition that becomes a factor of fluctuation of the score of each component data by operation information counter 8a configuring client 7A, such as the suction rate, the recognition rate, or the loss rate.

Figure 4:
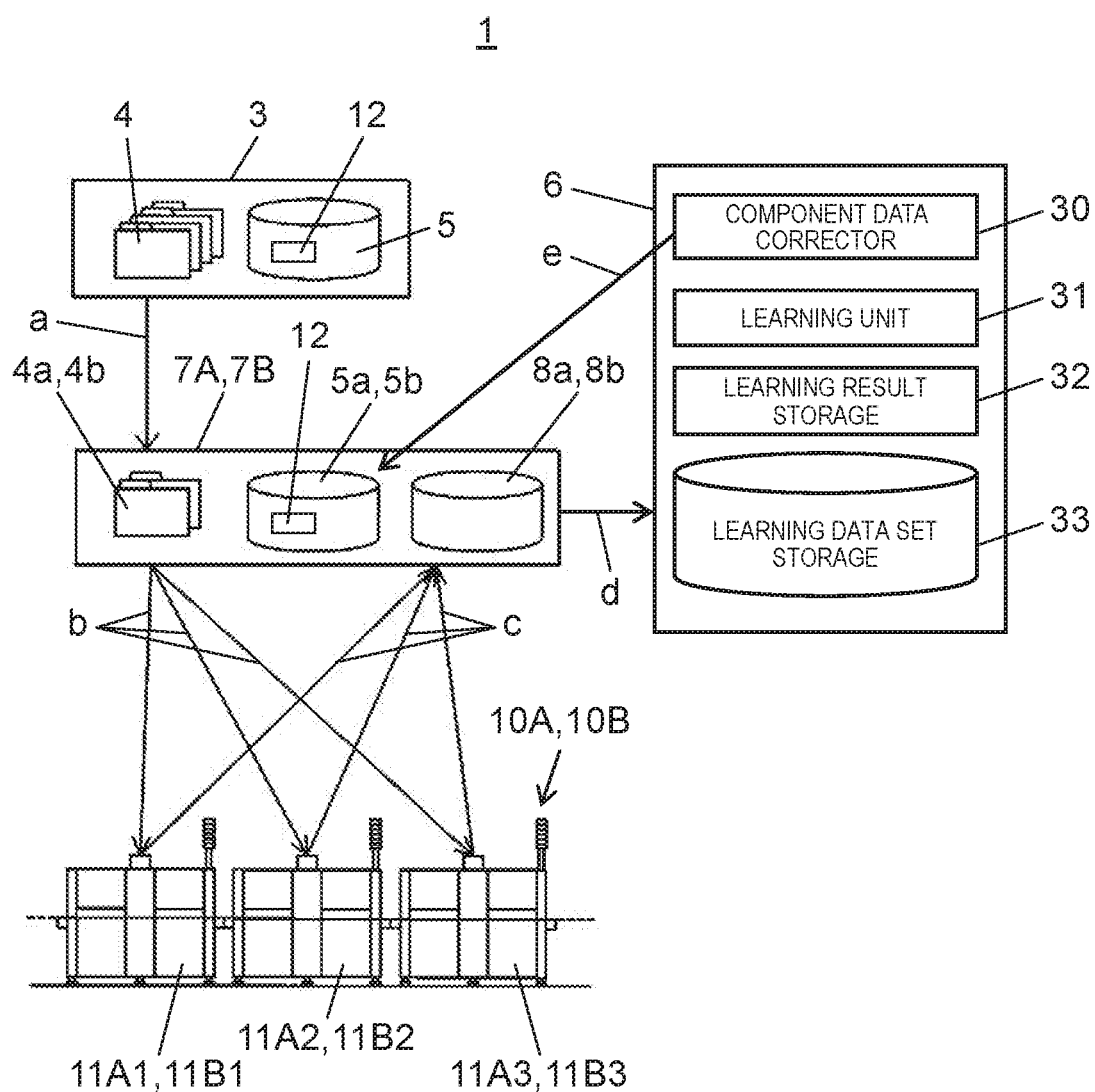
FIG. 4 is an explanatory view illustrating a mode of correction processing of component data in the mounting board manufacturing system of the embodiment.

Next, correction processing of the component data performed in a process, in which the component placing work is continuously executed by component mounting line 10 in mounting board manufacturing system 1, will be described with reference to FIG. 4. The correction processing of the component data is performed by the processing function of component library manager 6 illustrated in FIG. 1.

Component library manager 6 includes component data corrector 30, learning unit 31, learning result storage 32, and learning data set storage 33. Component data corrector 30 automatically corrects machine parameter 14 determined to be changed among machine parameters 14 included in component data 12 stored in component libraries 5a and 5b in a process in which the component placing work is continuously executed. The data correction is performed based on a result of counting the score of the component placing work executed for the production of the mounting boards by component mounting lines 10A and 10B by operation information counters 8a and 8b respectively included in clients 7A and 7B for each component data. Here, the component data of which the score of the component placing work is poor is searched as component data (correction component data) that is the target to be corrected.

That is, component data corrector 30 is a corrector that selects the component data that is the target to be corrected based on the score counted by operation information counters 8a and 8b, and corrects at least one machine parameter (control parameter) included in the selected component data. In the embodiment, component data corrector 30 executes the correction of machine parameter 14 using information (see learning result 50 illustrated in FIG. 5B) regarding a degree of influence of machine parameter 14 with respect to the score of the component placing work. Learning unit 31 has a function of learning the degree of influence of machine parameter 14 for each component data. For learning by learning unit 31, a method of inferring a correlation between factors and effects is used to a large number of data such as artificial intelligence applying a neural network.

Learning result storage 32 stores learning result 50 (FIG. 5B) learned by learning unit 31. Learning data set storage 33 stores learning data set 40 (FIG. 5A) for each component data 12 used for learning of learning unit 31. Here, learning data set 40 is obtained by accumulating a plurality of patterns (first patterns) combining component data 12 and the score when component data 12 is used based on a correction history of component data 12.

Figures 5A, 5B:
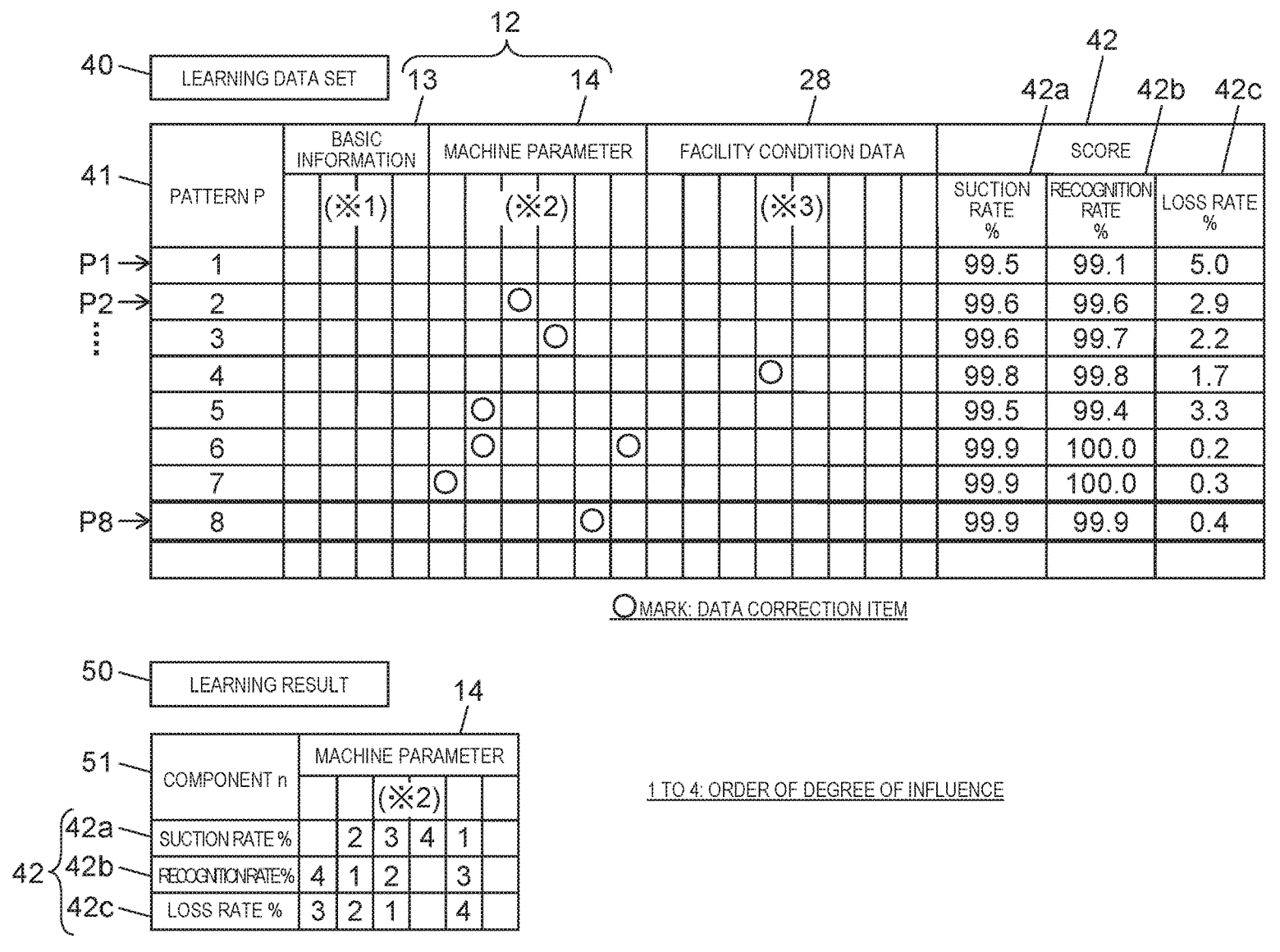

That is, as illustrated in FIG. 5A, in learning data set 40, the number of patterns (1, 2, . . . ) attached to pattern P in a time series order is described in pattern column 41.

Patterns P1, P2, ... specified by the number of patterns are configured of a factor data group and an effect data group. The factor data group is a data group obtained by serially combining component data 12 including basic information 13 and machine parameter 14, and facility condition data 28. In addition, the effect data group is a data group configured of "suction rate %" 42a, "recognition rate %" 42b, and "loss rate %" 42c configuring "score" 42.

The minor classification items respectively indicated by *1 and *2 in FIG. 2 are described in basic information 13 and machine parameter 14 as respective corresponding items of the changing target. An individual item indicated by *3 in FIG. 3 is described in facility condition data 28 as an item of the changing target. In the change in component data 12 in mounting board manufacturing system 1 described in the embodiment, the items of the changing targets may be appropriately changed by determination of an operator or an automatic correction function of component data 12 included in component data corrector 30 of component library manager 6.

In the table of FIG. 5A, Items marked with O indicate data correction items changed by the operator or by component data corrector 30 in the related pattern. Every time data is changed for component data 12 and facility condition data 28 as a target, new pattern P included in component data 12 and facility condition data 28 after changed is created.

That is, basic information 13 and machine parameter 14 are acquired from component data 12 included in component libraries 5a and 5b, facility condition data 28 is acquired from production data 4a and 4b, and these are taken as the factor data groups. In addition, when component placing devices 11 of component mounting lines 10A and 10B are operated by using the factor data groups, operation information counters 8a and 8b count and acquire the score of the component placing work, and make the score the effect data group. New pattern P is created by combining the factor data group and the effect data group.

In the example illustrated in FIG. 5A, pattern P2 after data change is created at the timing when data change is first made on machine parameter 14, and at the same time, pattern P1 before data change is created. Thereafter, when any one of the items of machine parameter 14 and facility condition data 28 is changed at any time by the operator, or by component data corrector 30, new patterns P3, ... are sequentially created based on data contents which are newly changed on every change. In new patterns P3, ... "suction rate %" 42a, "recognition rate %" 42b, and "loss rate %" 42c configuring "score" 42 are updated by reflecting the data change contents. That is, the effect of the component data correction is reflected in the operation state of component placing device 11 and thereby "score" 42 is changed.

Pattern P8 at an end of pattern column 41 in learning data set 40 is a pattern including latest machine parameter 14 which is currently used. Even after this time point, as long as the operation of component placing device 11 continues, new pattern P is accumulated in learning data set 40 each time data is changed. Learning data set 40 in which new pattern P is accumulated is stored in learning data set storage 33. Learning result 50 indicates a result obtained by learning the degree of influence by learning unit 31 for each component data of machine parameter 14 with respect to the score of the component placing work based on learning data set 40 created as described above.

That is, as illustrated in FIG. 5B, in learning result 50, the type of the component that is the target of learning is specified by "component n" 51 that is the component code. For each of score items of "suction rate %" 42a, "recognition rate %" 42b, and "loss rate %" 42c configuring score 42 of the component placing work with the component as the work target, which of items (minor classification items indicated by *2 in FIG. 2) of the changing target in machine parameter 14 has a greater degree of influence on the score item is indicated by the order of the degree of influence of 1 to 4.

Learning result 50 which is created as described above is referred to when machine parameter 14 is corrected by component data corrector 30. That is, for the component data specified by "component n" 51, in a case where it is determined that any of the score items configuring "score" 42 is defective, an item of which the degree of influence is high with respect to the defect can be estimated by referring to learning result 50 based on the order of the degree of influence. When machine parameter 14 of component data 12 is correction component data corrector 30 selects as a target to be corrected component data in the order from the item having the highest degree of influence of machine parameter 14. Moreover, as the data contents of learning result 50, various types of data other than the order of the degree of influence illustrated here can be used as long as they include contents serving as guidelines for the component data correction.

Next, details of the correction processing of component data 12 illustrated in FIG. 4 will be described. First, prior to the execution of the component placing work, production data 4 and component data 12 used in component mounting lines 10A and 10B are downloaded from server 3 to clients 7A and 7B (arrow a). Therefore, in the component placing work, production data 4a and 4b, and component data 12 corresponding to the types of the boards of the mounting boards respectively produced in component mounting lines 10A and 10B are downloaded to clients 7A and 7B. Therefore, component data 12 used in the component mounting line is accumulated in component libraries 5a and 5b of clients 7A and 7B.

Next, in component mounting lines 10A and 10B, production data 4a and 4b used in component placing device 11 are downloaded from clients 7A and 7B, and the component data codes of downloaded production data 4a and 4b are downloaded from clients 7A and 7B (arrow b). Therefore, in component mounting lines 10A and 10B, the mounting board can be manufactured by using production data 4a and 4b, and component data 12 which are downloaded.

Therefore, when the operation of component placing device 11 is started, operation information (log information) output from component placing device 11 during the operation of the device is collected by operation information counters 8a and 8b (arrow c). Operation information counters 8a and 8b count the score of the component placing work executed by component placing device 11 in component data unit based on the collected operation information. The counted result of the score is transmitted to component library manager 6 (arrow d), is a target of learning by learning unit 31, and the score of pattern P of learning data set 40 is also sequentially updated.

When data change processing for changing any of machine parameters 14 of component data 12 stored in component libraries 5a and 5b is performed during execution of the component placing work in component mounting lines 10A and 10B, the change contents are applied to all component placing devices 11 of component mounting line 10. New pattern P is generated in learning data set 40 based on changed component data 12.

When pattern P of learning data set 40 is accumulated by changing the machine parameter as described above, the degree of influence of machine parameter 14 (control parameter) of component data 12 with respect to the score of the component placing work is learned by learning unit 31. The learning result is stored in learning result storage 32. Component data corrector 30 automatically corrects component data 12 in which the score of the component placing work does not reach a predetermined level based on the learning result stored in learning result storage 32 (arrow e).

Therefore, also in a case where automatic correction is performed by component data corrector 30, the change contents by the correction is applied to all component placing devices 11 of component mounting line 10. New pattern P is generated in learning data set 40 based on changed component data 12 and learning data set 40 is updated. Learning unit 31 performs learning of the degree of influence based on updated learning data set 40.

That is, in the embodiment, when machine parameter 14 is corrected by component data corrector 30, learning data set 40 is updated and learning unit 31 performs learning of the degree of influence based on updated learning data set 40. Therefore, pattern P of learning data set 40 is accumulated and the degree of accumulation increases, so that accuracy of the degree of learning of component data 12 is enhanced and machine parameter 14 of component data 12 can be updated to a more appropriate content.

In order to increase the degree of accumulation of pattern P in learning data set 40, a range of pattern P included in learning data set 40 is not limited to the same component data as component data 12 that is the target of learning, and may be expanded to a pattern (second pattern) acquired for similar component data.

That is, in learning data set 40 illustrated in FIG. 5A, the accumulated pattern is limited to a pattern (first pattern) obtained by combining the same component data as component data 12 that is the target of learning and the score when the component data is used.

On the other hand, in learning data set 40A illustrated in FIG. 6, pattern P included and accumulated in pattern column 41 includes a pattern (second pattern) obtained by combining the component data (similar component data) similar to component data 12 that is the target of learning and the score when the similar component data is used. For example, in pattern column 41, patterns P5* and P6** indicated by 5* and 6 are patterns obtained by combining the component data similar to component data 12** that is the target of learning and the score when the similar component data is used.

That is, learning data set 40A in which the range of the pattern is enlarged is obtained by accumulating a plurality of patterns obtained by combining the component data similar to component data 12 and the score when the similar component data is used based on the correction history of component data 12 in addition to the pattern in learning data set 40. The similarity determination of component data 12 is performed by comparing shape 13a and size 13b included in basic information 13 of component data 12 with other component data 12. As described above, the range of pattern P included in learning data set 40A is enlarged to similar component data 12, so that the degree of accumulation of pattern P can be increased in a short period of time and the learning efficiency by learning unit 31 can be improved.

Figure 7:
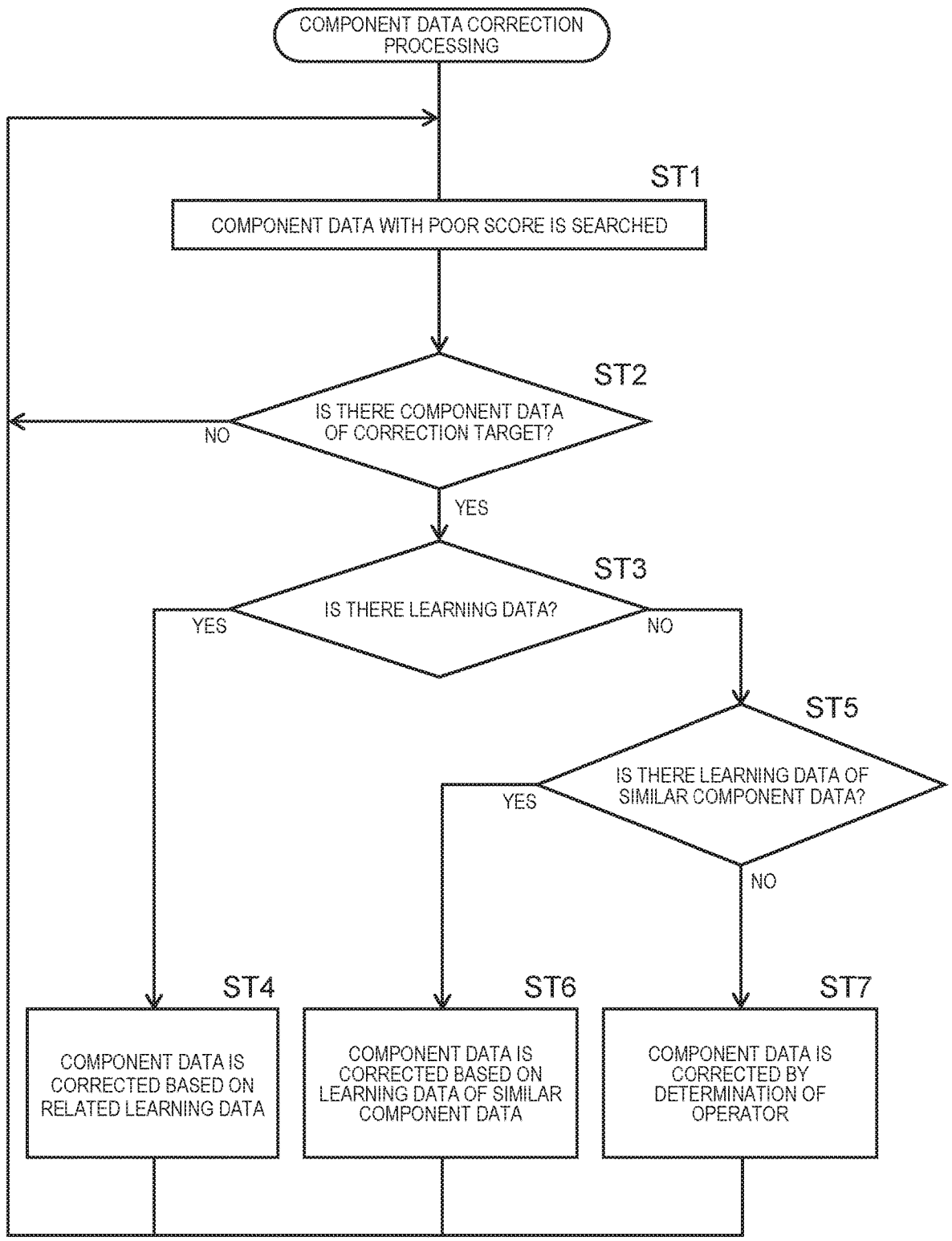
FIG. 7 is a flowchart illustrating component data correction processing in the mounting board manufacturing system of the embodiment.

Next, in mounting board manufacturing system 1 having the configuration, the component data correction processing executed by component library manager 6 will be described with reference to a flow of FIG. 7. First, component data 12 with poor score is searched by referring to the score of component data 12 counted by operation information counters 8a and 8b (ST1). Here, component data 12 with a score lower than a level (required correction level) that requires preset correction is searched.

Presence or absence of component data 12 (correction component data) of the target to be corrected is determined based on the search result (ST2). Here, in a case where there is no component data 12 that is the target to be corrected, the process returns to (ST1) and the search is continued. In a case where there is component data 12 that is the target to be corrected in (ST2), presence or absence of data (learning data) learned by related component data 12 is determined by referring the data of the learning result stored in learning result storage 32 (ST3).

Here, in a case where it is determined that there is the learning data, component data 12 is corrected based on the related learning data (ST4). In addition, in a case where it is determined that there is no learning data, presence or absence of the learning data is determined for the component data similar to component data 12 (ST5). Here, in a case where it is determined that there is the learning data, component data 12 is corrected based on the learning data of the similar component data (ST6). That is, component data corrector 30 corrects machine parameter 14 (control parameter) included in component data 12 by using information regarding the degree of influence in the learning data of component data 12 similar to component data 12 that is the target to be corrected. The determination of the similarity of component data 12 is performed by comparing shape 13a and size 13b included in basic information 13 of component data 12 with other component data 12.

In a case where it is determined that there is no learning data in (ST5), component data 12 is corrected for convenience by the determination of the operator (ST7). In this case, default data stored in component library 5 may be diverted. In either case (ST4), (ST6), or (ST7), the process returns to (ST1), the search of component data 12 with poor score is continued, and similar data correction work is repeatedly executed. In the process of repeating the data correction work, the correction of the machine parameter is performed based on information regarding the degree of influence on the score that is the learning result acquired by learning. As described above, there is no case where it is determined that there is no learning data in (ST5), and correction accuracy of component data 12 can be improved by repeating learning.

Figure 8:
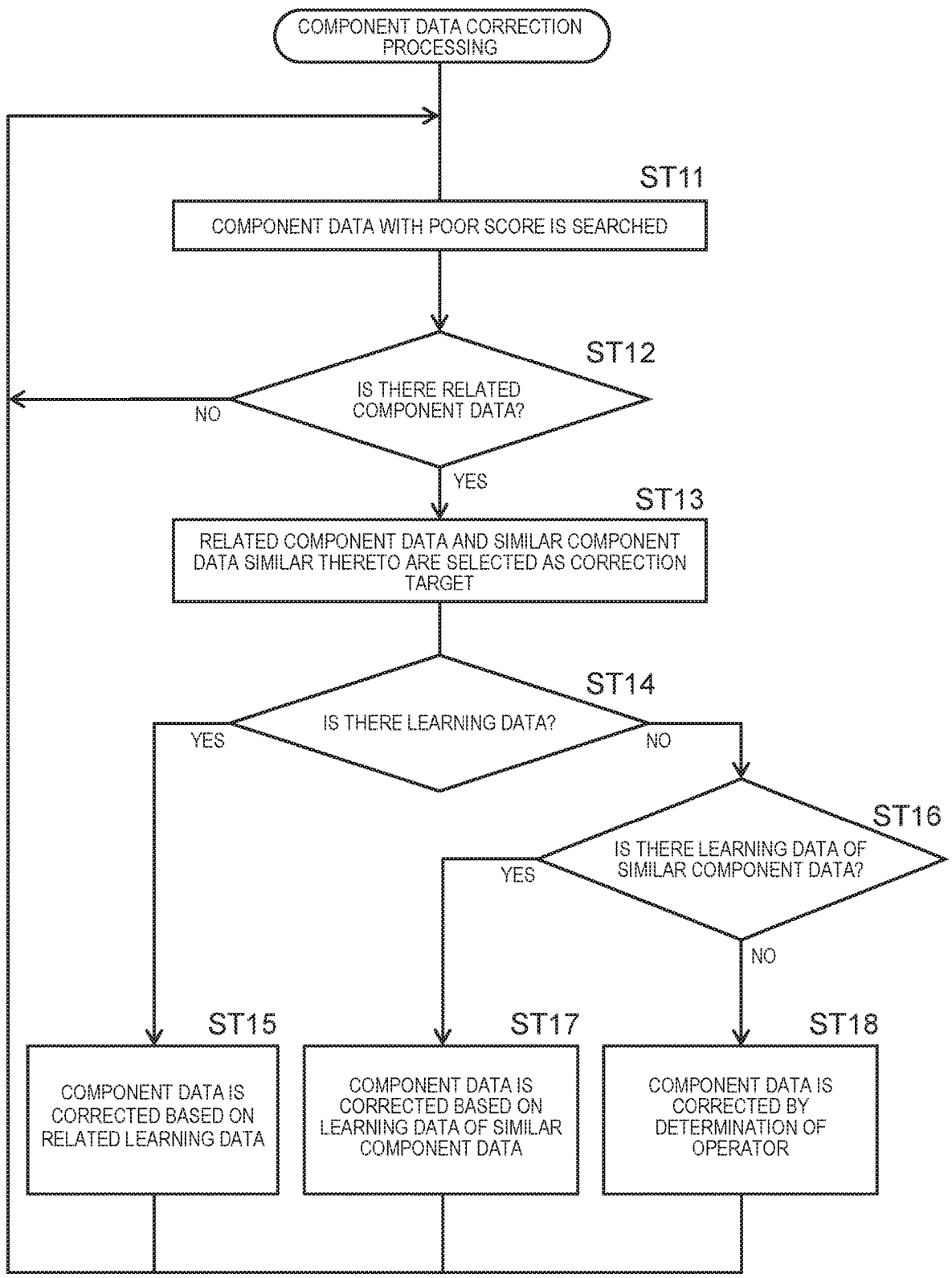
FIG. 8 is a flowchart illustrating component data correction processing in the mounting board manufacturing system of the embodiment.

Next, in mounting board manufacturing system 1, the component data correction processing executed by component library manager 6 will be described with reference to a flow of FIG. 8. In the example illustrated here, component data 12 (correction component data) that is the target to be corrected is expanded to the component data similar to component data 12 and the time required for learning is shortened. First, component data 12 with poor score is searched by referring the score of component data 12 counted by operation information counters 8a and 8b (ST11). Here, similar to (ST1), component data with a score lower than a level (required correction level) that requires preset correction is searched.

Presence or absence of related component data 12 is determined based on the search result (ST12). Here, in a case where there is no related component data 12, the process returns to (ST11) and the search is continued. In a case where there is related component data 12 in (ST12), component data 12 and the similar component data that is similar thereto are selected as the target to be corrected (ST13). At least one machine parameter 14 included in component data 12 is corrected for the selected component data as the target.

That is, in the component data correction processing illustrated here, component data corrector 30 corrects at least one control parameter included in the component data similar to component data 12 selected as component data 12 that is the target to be corrected.

Here, in a case where there is no similar component data, only related component data 12 with poor score is the target to be corrected. For component data 12 that is the target to be corrected, the following correction processing is executed. Here, first, related component data 12 is the target of the correction processing and then the similar component data is sequentially the target of the correction processing. In the correction processing, first, presence or absence of the learning data is determined for related component data 12 (ST14). In a case where it is determined that there is the learning data, related component data 12 is corrected based on the related learning data (ST15). In addition, in a case where it is determined that there is no learning data, presence or absence of the learning data is further determined for the component data similar to related component data 12 (ST16).

Here, in a case where it is determined that there is the learning data, related component data 12 is corrected based on the learning data of the similar component data (ST17). In a case where it is determined that there is no learning data in (ST16), component data 12 is corrected for convenience by the determination of the operator (ST18). In this case, the default data stored in component library 5 may be diverted.

The processes of (ST14) to (ST18) are repeatedly executed for the component data that is the target of the correction processing. Here, when the processes are completed for all the component data selected in (ST13), in either case (ST15), (ST17), or (ST18), the process returns to (ST11). Thereafter, the search of component data 12 with poor score is continued, and similar data correction work is repeatedly executed.

As described above, the embodiment relates to mounting board manufacturing system 1 for manufacturing the mounting board in which the component is installed on the board. Mounting board manufacturing system 1 includes component placing device 11, component libraries 5a and 5b, operation information counters 8a and 8b, and component data corrector 30.

Component placing device 11 executes the component placing work for placing the component on the board.

Component libraries 5a and 5b store the plurality of component data 12. Component data 12 includes machine parameter 14 (control parameter) for executing the component placing work by component placing device 11 and the information regarding the component.

Operation information counters 8a and 8b count the score of the component placing work for each component data based on the operation information including the result of processing executed by component placing device 11.

Component data corrector 30 selects the component data that is the target to be corrected based on the score of the component placing work and corrects machine parameter 14 included in the component data.

Therefore, it is possible to reflect the score indicating the operation state in the component placing work on the correction of the component data. Therefore, the correction work of the component data required for advanced expertise such as skill based on specialized knowledge and experience regarding the component installation can be appropriately and efficiently performed without depending on the experience and know-how of the operator.

In the embodiment described above, as the configuration of mounting board manufacturing system 1, a configuration example, in which a plurality of component mounting lines 10 in which a plurality of component placing devices 11 are disposed are included, is illustrated, but the disclosure is not limited to such a configuration. That is, as long as at least one component placing device 11, the component library that stores the plurality of component data 12, the operation information counter that counts the score of the component placing work for each component data, and the component data corrector that selects the component data that is the target to be corrected based on the score of the component placing work and corrects the component data are provided, the disclosure is applicable.

According to the disclosure, the correction of the component data is appropriately and efficiently performed.

The mounting board manufacturing system of the disclosure has an effect in which the correction of the component data can be appropriately and efficiently performed, and is useful in a field of manufacturing the mounting board by installing the component on the board.

What is claimed is:

1. A mounting board manufacturing system comprising:
a component placing device that executes component placing work for placing a component on a board;
a library that stores a plurality of component data, each of the plurality of the component data including a plurality of control parameters for executing the component placing work by the component placing device and information regarding the component;
an operation information counter that counts a score of the component placing work for each of the plurality of component data, wherein the score includes a success rate of the work executed by the component placing device; a learning unit;
a learning data set storage that stores learning data set for each component data, the learning data set including a plurality of patterns combining the component data and the score based on a correction history; and
a corrector that selects correction component data from the plurality of the component data based on the score of each of the plurality of component data and corrects one of the plurality of control parameters of the correction component data,
wherein a new pattern is created in the learning data set when one of the plurality of control parameters is changed by an operator or the corrector, and
wherein the learning unit learns a degree of influence of the plurality of control parameters on the score for the component based on the plurality of patterns in the learning data set.

2. The mounting board manufacturing system of claim 1, wherein the corrector corrects the control parameter using information regarding which control parameter has a greatest degree of influence on the score.

3. The mounting board manufacturing system of claim 2, wherein the corrector corrects the control parameter using information regarding the degree of influence of similar component data similar to the correction component data.

4. The mounting board manufacturing system of claim 1, wherein the score includes data of a suction rate of the component in the component placing work.

5. The mounting board manufacturing system of claim 1, wherein the score includes data of a recognition rate of the component in the component placing work.

6. The mounting board manufacturing system of claim 1, wherein the score includes data of a loss rate of the component in the component placing work.

7. A mounting board manufacturing system comprising:
a component placing device that executes component placing work for placing a component on a board;
a library that stores a plurality of component data, each of the plurality of the component data including a control parameter for executing the component placing work by the component placing device and information regarding the component;
an operation information counter that counts a score of the component placing work for each of the plurality of component data based on operation information including a result of the work executed by the component placing device; and
a corrector that selects correction component data that is a target to be corrected from the plurality of the component data based on the score and corrects the control parameter of the correction component data,
wherein a learning data set is obtained by accumulating a first pattern based on the correction history of the component data and a second pattern acquired for similar component data and the score when the similar component data is used.

8. The mounting board manufacturing system of claim 7, wherein the corrector corrects the control parameter included in the similar component data similar to the selected correction component data.

\* \* \* \* \*